United States Patent
Lo

(10) Patent No.: US 9,638,596 B2
(45) Date of Patent: May 2, 2017

(54) CAVITY-DOWN PRESSURE SENSOR DEVICE

(71) Applicant: Wai Yew Lo, Petaling Jaya (MY)

(72) Inventor: Wai Yew Lo, Petaling Jaya (MY)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 621 days.

(21) Appl. No.: 14/248,324

(22) Filed: Apr. 8, 2014

(65) Prior Publication Data

US 2015/0285702 A1    Oct. 8, 2015

(51) Int. Cl.
| | |
|---|---|
| *G01L 9/00* | (2006.01) |
| *H01L 23/495* | (2006.01) |
| *H01L 25/04* | (2014.01) |
| *G01L 19/00* | (2006.01) |
| *G01L 19/06* | (2006.01) |

(52) U.S. Cl.
CPC ........ *G01L 9/0052* (2013.01); *G01L 19/0069* (2013.01); *G01L 19/06* (2013.01); *H01L 23/4951* (2013.01); *H01L 23/49503* (2013.01); *H01L 23/49513* (2013.01); *H01L 25/041* (2013.01); *B81B 2201/0228* (2013.01); *B81B 2201/0264* (2013.01)

(58) Field of Classification Search
CPC ........ B81B 22/0264; B81B 2201/0264; B81B 2201/0228; B81B 2201/0242; B81B 2201/021; H01L 23/4951; H01L 23/49503; H01L 23/49506; H01L 23/49513

USPC ....... 257/787, 777, 790, 414, 723, 724, 778; 438/51

See application file for complete search history.

(56) References Cited

U.S. PATENT DOCUMENTS

| | | | |
|---|---|---|---|
| 5,646,828 A * | 7/1997 | Degani | ................... H01L 23/13 257/707 |
| 6,313,525 B1 | 11/2001 | Sasano | |
| 6,316,840 B1 * | 11/2001 | Otani | .................... B81C 1/0023 257/417 |
| 6,515,361 B2 | 2/2003 | Lee | |
| 7,162,927 B1 | 1/2007 | Selvan | |
| 7,411,281 B2 | 8/2008 | Zhang | |
| 7,786,591 B2 | 8/2010 | Khan | |
| 8,359,927 B2 | 1/2013 | Hooper | |
| 8,816,492 B1 * | 8/2014 | Minervini | ........... B81C 1/00261 257/701 |
| 2012/0139067 A1 | 6/2012 | Lo | |
| 2013/0207207 A1 * | 8/2013 | McDonald | .......... G01L 19/0069 257/415 |
| 2014/0027867 A1 * | 1/2014 | Goida | ................. H01L 23/3675 257/416 |
| 2014/0033814 A1 | 2/2014 | Wen | |

\* cited by examiner

*Primary Examiner* — Anthony Ho
*Assistant Examiner* — Antonio Crite
(74) *Attorney, Agent, or Firm* — Charles E. Bergere

(57) ABSTRACT

A cavity-down pressure sensor device has a pressure-sensing die that is electrically connected to a master control unit (MCU) using face-to-face bonding. Connecting the pressure-sensing die in this manner avoids the need to wire bond the pressure-sensing die to the master control unit.

12 Claims, 2 Drawing Sheets

CAVITY-DOWN PRESSURE SENSOR DEVICE

BACKGROUND OF THE INVENTION

The present invention relates generally to semiconductor sensor devices and, more particularly to a method of assembling a pressure sensor device.

Pressure sensor devices use pressure-sensing dies (a.k.a. P-cells), such as piezo-resistive transducers (PRTs) and parameterized layout cells, to detect ambient atmospheric pressure. Pressure-sensing dies are referred to herein as P-cells; however, it should be understood that any suitable pressure-sensing die may be used.

P-cells are susceptible to damage during assembly and use. P-cells cannot be encapsulated in conventional mold compound because that would impede their functionality. Instead, P-cells are placed within device cavities and covered with a pressure-sensitive gel that protects the P-cells from damage during assembly and use, while still enabling the dies to function properly.

Conventional cavity-fill pressure sensor devices use bond wires to connect the P-cell to a master control unit (MCU) die also located within the device cavity. In addition, pressure sensor devices often include a gravity-sensing (G-cell) die that also is connected to the MCU with bond wires. As a result, the cavity must be large enough to accommodate the various dies as well as the bond wires interconnecting those dies. The large cavity requires more pressure-sensitive gel, which is relatively expensive, thereby increasing the cost of assembly.

BRIEF DESCRIPTION OF THE DRAWINGS

Embodiments of the present disclosure are illustrated by way of example and are not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION OF THE INVENTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the disclosure.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures. For example, two figures shown in succession may in fact be executed substantially concurrently or may sometimes be executed in the reverse order, depending upon the functionality/acts involved.

In one embodiment, the present invention provides a method of assembling a pressure sensor device and the resulting pressure sensor device. There is a need to reduce the assembly costs of pressure sensor devices. In order to reduce cost, a cavity-down pressure sensor device is provided. The cavity-down pressure sensor device employs face-to-face bonding using conductive elements, such as stud connections or copper pillar bumps, instead of bond wires to electrically interconnect dies. Using a cavity-down pressure sensor device also makes possible smaller package profiles.

FIGS. 1A-1H show simplified cross-sectional side views of different phases of a method of assembling a pressure sensor device 100 in accordance with an embodiment of the present invention.

Figure 1A:
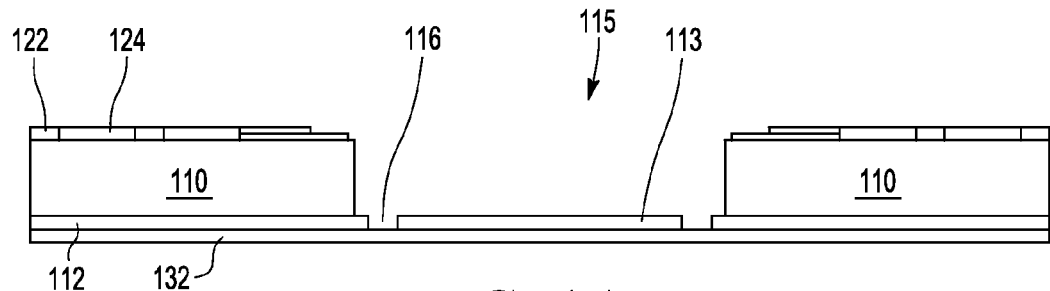
FIG. 1A is a cross-sectional side view of a stage during the process of assembling a pressure sensor device according to one embodiment of the present invention.

FIG. 1A shows a sub-assembly having a lead frame 112 whose lower surface is laminated with a tape 132 (e.g., polyimide). A portion of the lead frame 112 forms a die paddle 113 to which one or more dies may be attached. The lead frame 112 may be formed of a durable and stiff material, such as bare metal (e.g., copper), stainless steel, or a plated metal.

One or more holes 116 are formed in the lead frame 112 proximate to the die paddle 113. Two holes 116 are shown in FIG. 1A; however, it should be understood that this is a simplified cross-sectional view and more holes may be present. The holes 116 may be formed in the lead frame 112 by a suitable fabrication process such as drilling or punching.

A substrate 110 rests on the upper surface of the lead frame 112. On the upper surface of the substrate 110 are solder mask 122 and conductive traces 124, which may be metal traces. The substrate 110, which may be formed using mold compound, has a central opening and is configured on the lead frame 112 in such a way that the central opening forms a cavity 115 over the die paddle 113. In the orientation shown in FIG. 1A, during the device assembly process, the cavity 115 is oriented up.

Figure 1B:
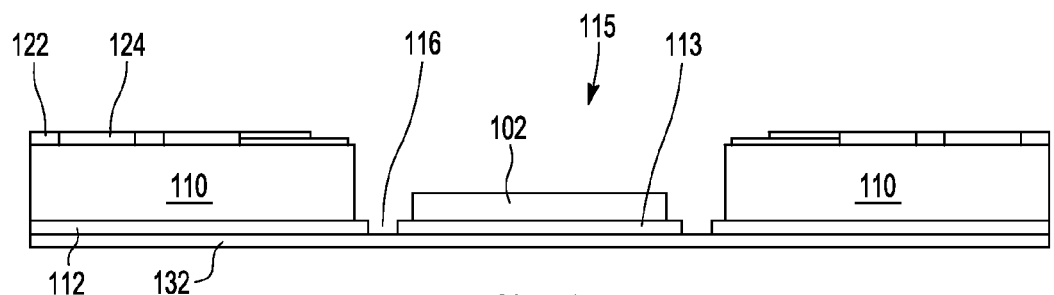
FIG. 1B is a cross-sectional side view of another stage during the process of assembling a pressure sensor device according to one embodiment of the invention.

FIG. 1B shows an integrated circuit die, in this case a master control unit (MCU) 102 that is attached to the die paddle 113. The MCU 102 is attached to the die paddle 113 in a die-bonding step using an epoxy-based die attach material or a film, as is known in the art. The MCU 102 may control the operations of one or more sensor dies and/or process signals generated by one or more sensor dies.

Figure 1C:
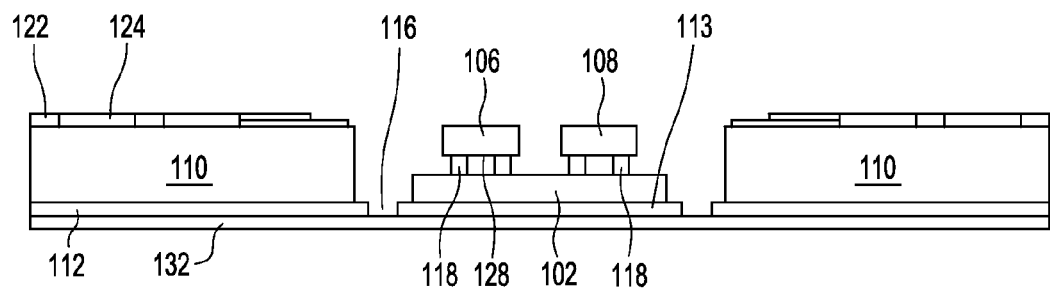
FIG. 1C is a cross-sectional side view of another stage during the process of assembling a pressure sensor device according to one embodiment of the invention.

FIG. 1C shows a P-cell 106 electrically connected to the MCU 102. By "electrically connected," it is meant that a signal may be transmitted from one die to the other via the connection. The P-cell 106 has a pressure-sensing active region 128 that generates signals based on ambient atmospheric pressure.

FIG. 1C further shows an optional acceleration-sensing die (aka G-cell) 108, which is also electrically connected to the MCU 102. The G-cell 108 senses gravity or acceleration in one, two, or all three axes, depending on the particular implementation.

The P-cell 106, MCU 102, and G-cell 108 are well known components of semiconductor sensor devices and thus detailed descriptions thereof are not necessary for a complete understanding of the invention. It is contemplated that, in some embodiments, the MCU 102 may implement both the functionality of an MCU and that of one or more sensors, such as a G-cell.

Still referring to FIG. 1C, the connections between (i) the P-cell 106 and the MCU 102 and between (ii) the G-cell 108 and the MCU 102 are based on face-to-face bonding. "Face-to-face bonding" is when two dies are electrically connected using stud or solder bumps located on both dies. The stud or solder bumps may be interconnected using a thermo-compression process. In the embodiment shown, the electrical connection is made via bumps 118. The bumps 118 may be, for example, stud bumps or solder bumps made of materials such gold, copper, silver or aluminum, and may or may not be plated. The P-cell 106 and G-cell 108 are face-to-face bonded to the MCU 102 by (i) forming bumps 118 on the MCU 102 at the appropriate locations (e.g., corresponding to MCU I/O pads (not shown)) (ii) placing the P-cell 106 and the G-cell 108 onto the bumps 118, and (iii) subjecting the sub-assembly to a reflow operation during which the sub-assembly is heated to allow the bumps 118 to reflow and form electrical and mechanical connections between the P-cell and G-cell dies 106 and 108 and the MCU 102.

In particular, the active region 128 of the P-cell 106 is face-to-face bonded to the MCU 102 using bumps 118 located between I/O pads (not shown) (i) on the MCU 102 and (ii) proximate to or on the active region 128 of the P-cell 106. In embodiments comprising a G-cell 108, the G-cell 108 also is face-to-face bonded to the MCU 102 using bumps 118 located between I/O pads (not shown) on both the G-cell 108 and the MCU 102.

It is further considered in alternative embodiments that flip-chip P-cells may be used. In the flip chip process, a P-cell die with bumps attaches to the I/O pads of the MCU or a substrate. The I/O pads of the MCU may be plated with gold or copper. The interconnection is formed using a reflow process. This differs from face-to-face bonding in which both dies have bumps instead of only one die. Using a flip-chip bonding technique would result in similar architecture as that achieved using face-to-face bonding. For both face-to-face bonding and flip-chip bonding, the active region of the P-cell faces the MCU.

Figure 1D:
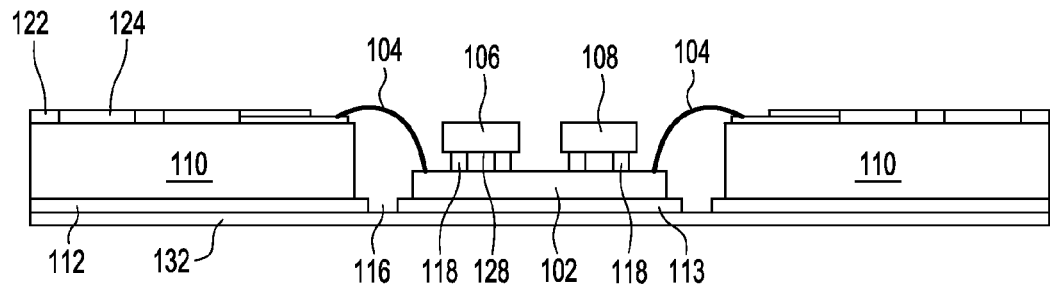
FIG. 1D is a cross-sectional side view of another stage during the process of assembling a pressure sensor device according to one embodiment of the invention.

FIG. 1D shows the sub-assembly after bond wires 104 are applied to electrically connect I/O pads on the MCU 102 to the conductive traces 124 located at the upper surface of the substrate 110, in the orientation shown in FIG. 1D. In the embodiment shown, the MCU 102 is electrically connected to the substrate by connecting the bond wires 104 to the metal traces 124. The bond wires 104 may be coated or uncoated, and plated or unplated, gold, aluminum, or copper wire or any other suitable type of bond wire.

Figure 1E:
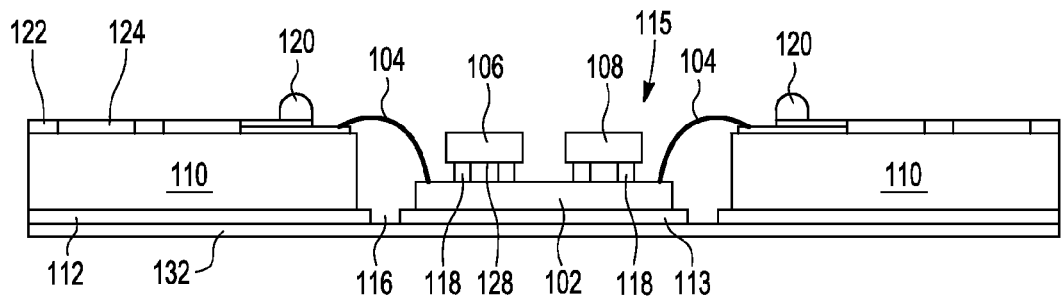
FIG. 1E is a cross-sectional side view of another stage during the process of assembling a pressure sensor device according to one embodiment of the invention.

FIG. 1E shows the formation of a dam 120 around the periphery of the cavity 115. However, in some embodiments, dam 120 might not be needed. The dam 120 functions to contain a gel 114 (FIG. 1F) used to fill the cavity 115.

Figure 1F:
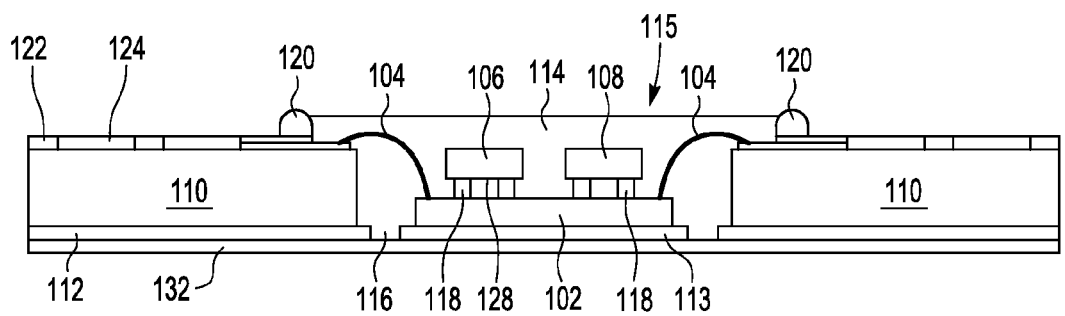
FIG. 1F is a cross-sectional side view of another stage during the process of assembling a pressure sensor device according to one embodiment of the invention.

FIG. 1F shows the cavity 115 after being at least partially filled with a pressure-sensitive gel 114. The pressure-sensitive gel 114 fills the spaces between the P-cell 106 and the MCU 102 and between the G-cell 108 and the MCU 102 via capillary action. The pressure-sensitive gel 114 may be a low-modulus silicone gel. Examples of suitable pressure-sensitive gels 114 are available from Dow Corning Corporation of Midland, Mich. The pressure-sensitive gel 114 covers at least the pressure-sensing active region 128 of the P-cell 106 while protecting the P-cell 106 from mechanical and environmental damage (e.g., contamination and/or corrosion) during both assembly and use. In the embodiment shown, the pressure-sensitive gel 114 also surrounds the G-cell 108, and covers the bond wires 104.

Figure 1G:
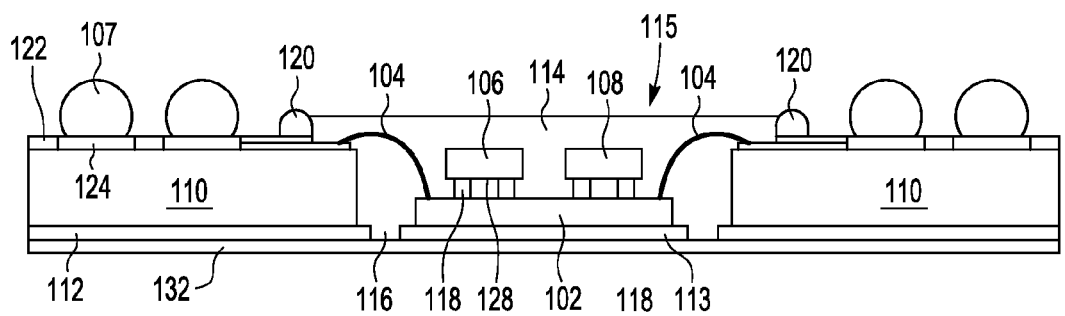
FIG. 1G is a cross-sectional side view of another stage during the process of assembling a pressure sensor device according to one embodiment of the invention.

FIG. 1G shows the sub-assembly after application of conductive balls, for example solder balls 107, on the conductive traces 124 on the upper surface of the substrate 110. Following the application of the solder balls 107, the sub-assembly is flipped over and the tape 132 is removed from the bottom surface of the lead frame 112.

Figure 1H:
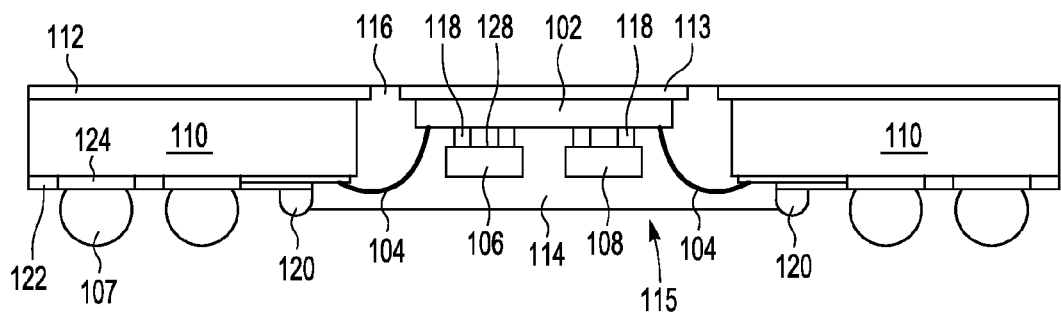
FIG. 1H is a cross-sectional side view of another stage during the process of assembling a pressure sensor device according to one embodiment of the invention.

FIG. 1H shows the fully assembled pressure sensor device 100 (prior to removal of the tape 132). The pressure sensor device 100 is the sub-assembly of FIG. 1G, after removal of tape 132 and after being flipped over into its cavity-down orientation in which it is to be mounted on a substrate, such as a printed circuit board (PCB) (not shown). The cavity 115 faces down towards the PCB on which it is to be mounted. The die paddle 113 of the lead frame 112 functions as a lid for the packaged device 100 with the holes 116 permitting ambient atmospheric pressure outside of the device to reach the active region 128 of the pressure-sensing die via the pressure-sensitive gel 114.

The solder balls 107 are located on the bottom of the pressure sensor device 100 to form a ball grid array (BGA) semiconductor device. Note that alternative embodiments are not limited to BGA packages, but can be implemented for other package types, such as (without limitation) quad flat no-leads (QFN) package, molded array packages (MAP), and quad flat pack (QFP) or other leaded packages.

FIGS. 1A-1H show one method of assembling a pressure sensor device 100. While one pressure sensor device 100 is shown being assembled, it should be understood that multiple pressure sensor devices 100 may be concurrently assembled on a one- or two-dimensional array of interconnected instances of the lead frame 112, where a singulation step is performed at the end of the assembly process to form individual, separated instances of pressure sensor device 100.

Certain embodiments of the present invention may provide one or more of the following advantages. Using face-to-face bonding avoids wire bonding between (i) the P-cell and the G-cell and (ii) the MCU, which in turn reduces the size of the cavity, resulting in the use of less pressure-sensitive gel. Using a cavity-down orientation enables the die paddle to function as a lid, thereby avoiding having to provide a separate lid structure.

One embodiment of the invention is a sensor device comprising a lead frame, a master control unit (MCU) die-bonded to the lead frame, and a P-cell comprising a pressure-sensing active region facing and electrically connected to the MCU.

Another embodiment of the disclosure is a method for assembling a sensor device. An MCU is die-bonded to a lead frame. A P-cell having a pressure-sensing active region is electrically connected to the MCU, wherein the pressure-sensing active region faces the MCU.

By now, it should be appreciated that there has been provided an improved packaged semiconductor pressure sensor device and a method of forming the improved packaged semiconductor pressure sensor device. Circuit details are not disclosed because knowledge thereof is not required for a complete understanding of the invention.

Although the invention has been described using relative terms such as "upper," "lower," "front," "back," "top," "bottom," "over," "above," "under" and the like in the description and in the claims, such terms are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Unless stated otherwise, terms such as "first" and "second" are used to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Although the disclosure is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

It should be understood that the steps of the exemplary method set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

The invention claimed is:

1. A sensor device, comprising:
   a lead frame having a die paddle;
   a master control unit (MCU) attached to the die paddle of the lead frame;
   a P-cell mounted on an active side of the MCU, wherein the P-cell has a pressure-sensing active region facing and electrically connected to the active side of the MCU;
   a substrate having a central opening attached to the lead frame, wherein the central opening forms a cavity, the die paddle is exposed through the central opening, and the MCU and the P-cell are located within the cavity;
   a pressure-sensitive gel covering the active region of the P-cell;
   bond wires electrically connecting the MCU to the substrate; and
   conductive balls attached to the substrate, wherein the conductive balls are electrically connected to the MCU by way of conductive traces in the substrate and the bond wires.

2. The sensor device of claim 1, wherein the P-cell is electrically connected to the MCU without using any bond wires.

3. The sensor device of claim 1, wherein the pressure-sensing active region of the P-cell and the MCU are electrically connected with conductive bumps.

4. The sensor device of claim 1, further comprising a G-cell mounted on and electrically connected to the MCU.

5. The sensor device of claim 1, wherein the central opening allows atmospheric pressure outside of the sensor device to reach the pressure-sensing active region of the P-cell.

6. The sensor device of claim 1, wherein lead frame includes a hole that enables atmospheric pressure to reach the pressure-sensing active region of the P-cell via the pressure-sensitive gel.

7. A method for assembling a sensor device, comprising:
   attaching a master control unit (MCU) to a die paddle of a lead frame, wherein a bottom side of the MCU is attached to the die paddle; and
   electrically connecting a P-cell having a pressure-sensing active region to the MCU, wherein the pressure-sensing active region faces an active side of the MCU;
   attaching a substrate having a central opening to the lead frame, wherein the die paddle is exposed through the central opening, and the MCU and P-cell are disposed within the cavity;
   at least partially filling the cavity with pressure-sensitive gel such that the gel covers the MCU and the P-cell;
   electrically connecting the MCU with the substrate with bond wires, wherein the gel also covers the bond wires; and attaching a plurality of conductive balls to the substrate, wherein the conductive balls are in electrical communication with the MCU by way of conductive traces in the substrate and the bond wires.

8. The method of claim 7, further comprising forming a dam around the cavity on a first surface of the substrate prior to dispensing the pressure-sensitive gel.

9. The method of claim 7, wherein electrically connecting the P-cell to the MCU comprises face-to-face bonding the P-cell to the MCU.

10. The method of claim 7, wherein electrically connecting the P-cell to the MCU comprises electrically connecting the P-cell to the MCU using bumps.

11. The method of claim 7, further comprising electrically connecting a G-cell to the MCU using face-to-face bonding.

12. The sensor device assembled in accordance with the method of claim 7.

* * * * *